United States Patent
Kwack

(10) Patent No.: US 7,773,449 B2
(45) Date of Patent: *Aug. 10, 2010

(54) APPARATUS AND METHOD OF CONTROLLING BANK OF SEMICONDUCTOR MEMORY

(75) Inventor: Seung-Wook Kwack, Gyeonggi-go (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/235,143

(22) Filed: Sep. 22, 2008

(65) Prior Publication Data

US 2009/0022005 A1 Jan. 22, 2009

Related U.S. Application Data

(63) Continuation of application No. 11/588,295, filed on Oct. 27, 2006, now Pat. No. 7,453,757.

(30) Foreign Application Priority Data

Nov. 29, 2005 (KR) ...................... 10-2005-0115076

(51) Int. Cl.
  *G11C 8/00* (2006.01)
(52) U.S. Cl. .................................. 365/230.03; 365/191
(58) Field of Classification Search ................. 365/191, 365/230.03
  See application file for complete search history.

(56) References Cited

U.S. PATENT DOCUMENTS

| 5,269,010 | A | 12/1993 | MacDonald |
| 6,301,187 | B1 * | 10/2001 | Ooishi et al. ........... 365/233.12 |
| 6,356,507 | B1 * | 3/2002 | Kaku et al. ............... 365/233.1 |
| 6,661,721 | B2 | 12/2003 | Lehmann et al. |
| 6,694,422 | B1 | 2/2004 | Kim |
| 2004/0027857 | A1* | 2/2004 | Ooishi ................... 365/185.11 |
| 2005/0140969 | A1 | 6/2005 | Kang et al. |
| 2005/0141225 | A1 | 6/2005 | Ko et al. |

FOREIGN PATENT DOCUMENTS

| JP | 2000-215663 | 8/2000 |
| JP | 215663 | 8/2000 |
| KR | 1020050041621 | 5/2005 |

* cited by examiner

*Primary Examiner*—Hoai V Ho
(74) *Attorney, Agent, or Firm*—Venable LLP; Jeffri A. Kaminski

(57) ABSTRACT

An apparatus for controlling bank of a semiconductor memory includes a plurality of banks, a peripheral circuit unit that generates and outputs a bank selection signal and a first address, and a bank controller that generates a second address obtained by correcting the first address to match a bank control timing and outputs the generated second address to a bank corresponding to the bank selection signal among the plurality of banks. Since it is easy to ensure a timing margin, it is possible to completely prevent an address generation error, minimize a layout area, and reduce current consumption.

11 Claims, 6 Drawing Sheets

APPARATUS AND METHOD OF CONTROLLING BANK OF SEMICONDUCTOR MEMORY

This application is a continuation of U.S. patent application Ser. No. 11/588,295, filed Oct. 27, 2006, now U.S. Pat. No. 7,453,757, the subject matter of which application is incorporated herein by reference in its entirety.

BACKGROUND

1. Technical Field

The present invention relates to a semiconductor memory apparatus, and more particularly, to an apparatus and method for controlling a bank of a semiconductor memory apparatus.

2. Related Art

In general, as shown in FIG. 1, the apparatus for controlling the bank of a semiconductor memory apparatus includes first to fourth bank areas 10 to 40, each of which has a plurality of banks (banks 0 to 3), and a peripheral circuit unit 50 that outputs a bank selection signal casp8<0:3> and a first address gay<2:9>. Further, FIG. 2 is a layout diagram of the configuration of FIG. 1. Here, the first address gay<2:9> is a column address for selecting a predetermined column of the bank.

Since the first to fourth bank areas 10 to 40 have the same structure, only the internal structure of the first bank area 10 is shown in FIG. 1. The structure is described below.

The first bank area 10 includes the plurality of banks (banks 0 to 3), and column controllers 11 to 14 that control the plurality of banks (banks 0 to 3), respectively. Here, each of the column controllers 11 to 14 generates a second address, which has a timing margin through a logic circuit and a delay element, by using each bit of the bank selection signal casp8<0:3> and the first address gay<2:9>.

Further, each of the column controllers 11 to 14 controls input and output of data at each of the banks (banks 0 to 3) by using the second address according to a clock timing.

However, the apparatus for controlling the bank of a semiconductor memory apparatus according to the related art has the following problems.

First, since the column controller controls the bank according to a clock timing, the column controller ensures a timing margin for performing the control operation according to a clock by delaying an address. However, variation in clock time affects the delay time. Further, as the clock time is reduced, it is difficult to ensure an exact delay time, and thus an error may occur in generating an address. In the case of a high-frequency system, the clock time is further reduced, and an error is more likely to occur in generating an address. Therefore, it is difficult to apply the apparatus for controlling bank of a semiconductor memory apparatus according to the related art to a high-frequency system.

Second, a layout area is increased because each of the column controllers has a delay logic for generating an address, and signal lines for supplying a bank selection signal and an address to each of the column controllers are formed, as shown in FIG. 2.

Third, unnecessary power is consumed because internal logic circuits of the corresponding column controller operate regardless of whether bank selection is made or not.

SUMMARY

Embodiments of the present invention provide an apparatus and a method of controlling the bank of a semiconductor memory apparatus that can easily ensure a timing margin for controlling the bank and reduce a layout area and power consumption.

In an embodiment of the present invention, an apparatus for controlling the bank of a semiconductor memory apparatus includes a plurality of banks, a peripheral circuit unit that generates and outputs a bank selection signal and a first address, and a bank controller that generates a second address by correcting the first address to match a bank control timing and outputs the generated second address to a bank corresponding to the bank selection signal among the plurality of banks.

According to another embodiment of the present invention, an apparatus for controlling the bank of a semiconductor memory apparatus includes a plurality of bank areas, each of which has a plurality of banks, a peripheral circuit unit that generates and outputs a bank selection signal and a first address, and a plurality of bank controllers, each of which generates a second address obtained by correcting the first address to match a bank control timing and outputs the generated second address to a bank corresponding to the bank selection signal among the plurality of banks in each of the bank areas.

According to yet another embodiment of the present invention, a method of controlling the bank of a semiconductor memory apparatus having a peripheral circuit unit generating a bank selection signal and a first address, column controllers, and a bank controller which includes causing the bank controller to correct the first address to match a bank control timing according to the bank selection signal so as to generate a second address, causing the bank controller to output the second address according to the bank selection signal, and causing the column controllers to control banks according to the second address.

BRIEF DESCRIPTION OF THE DRAWINGS

The above and other features and advantages of the present invention will become more apparent by describing in detail preferred embodiments thereof with reference to the attached drawings in which.

DESCRIPTION OF EXEMPLARY EMBODIMENTS

Embodiments of the present invention will now be described in detail with reference to the accompanying drawings.

Figure 1:
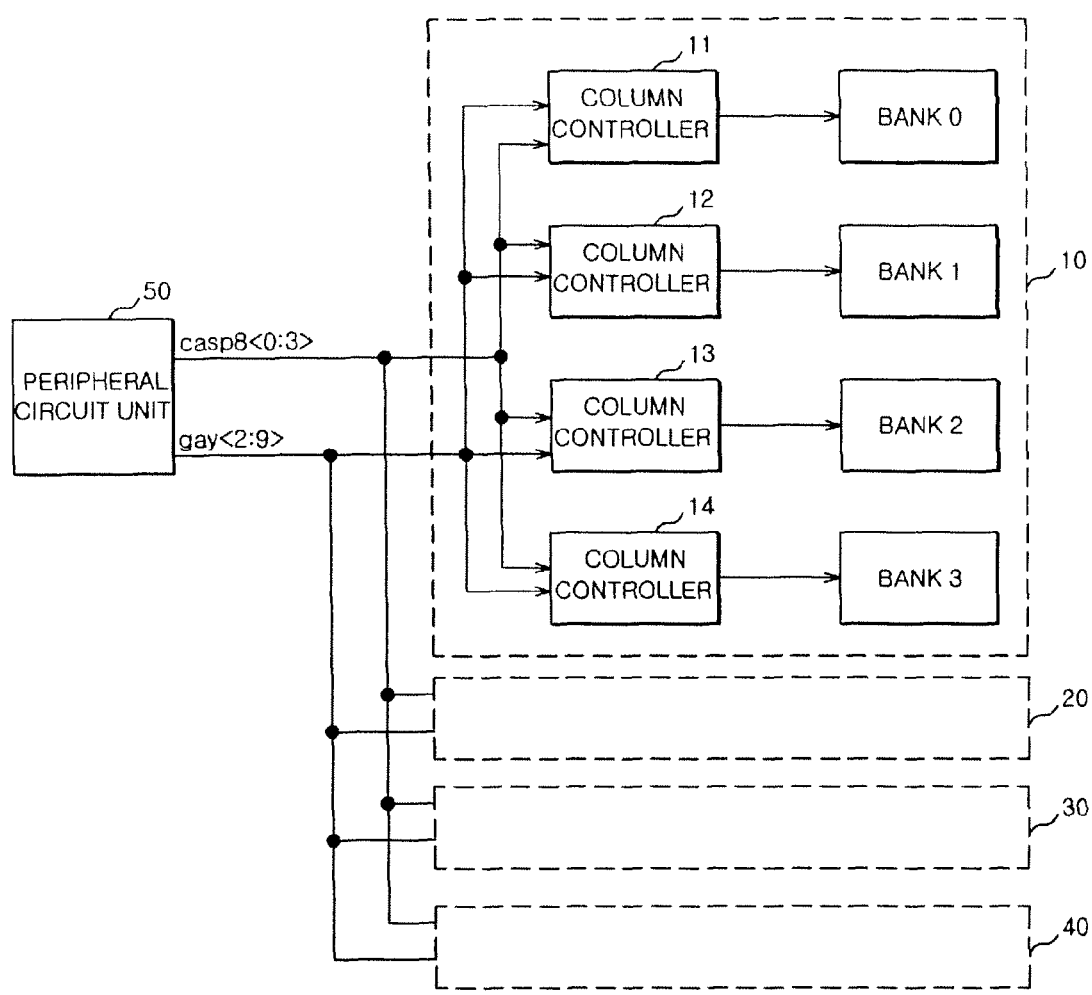
FIG. 1 is a block diagram showing the structure of an apparatus for controlling the bank according to the related art.
Figure 2:
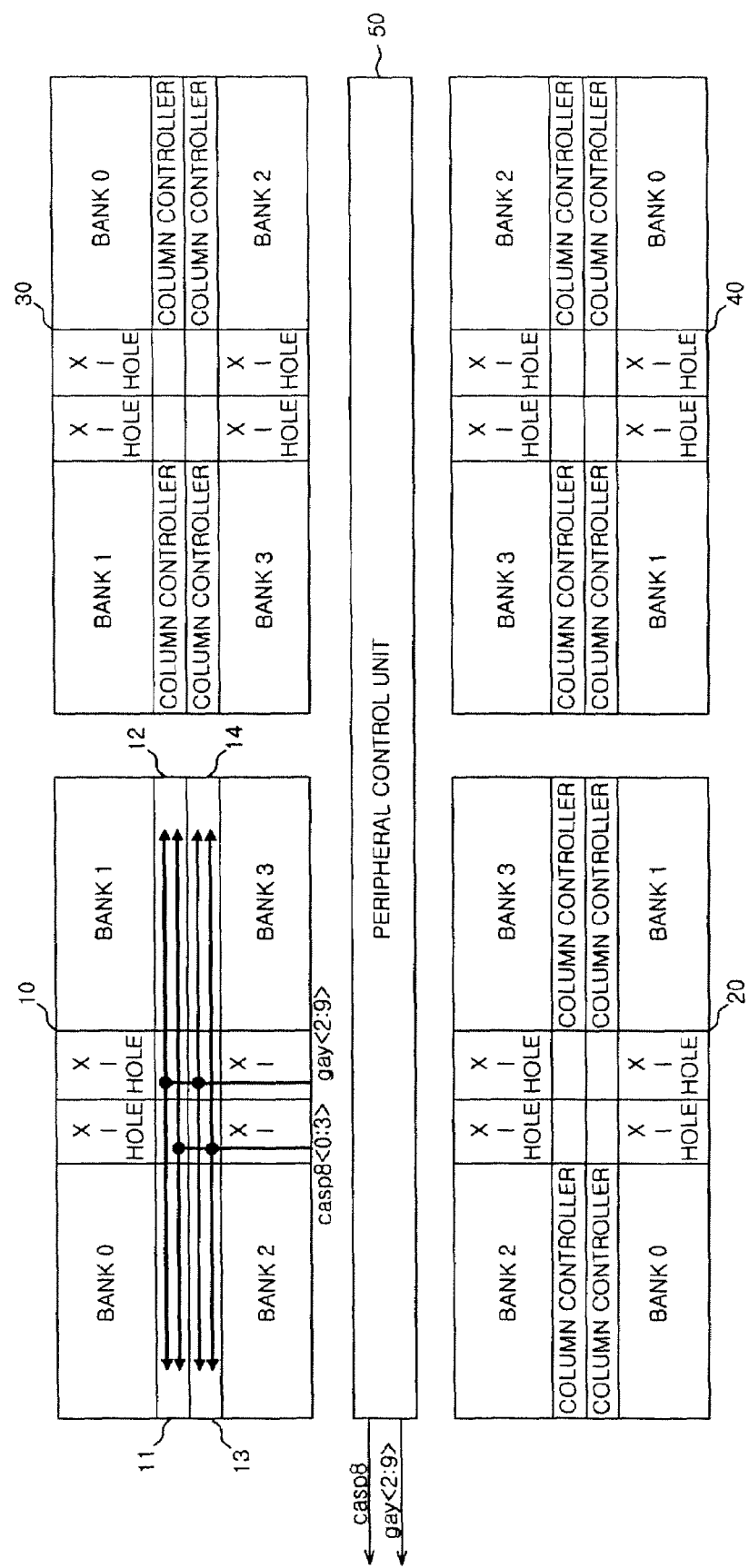
FIG. 2 is a layout diagram of the apparatus for controlling the bank according to the related art.
Figure 3:
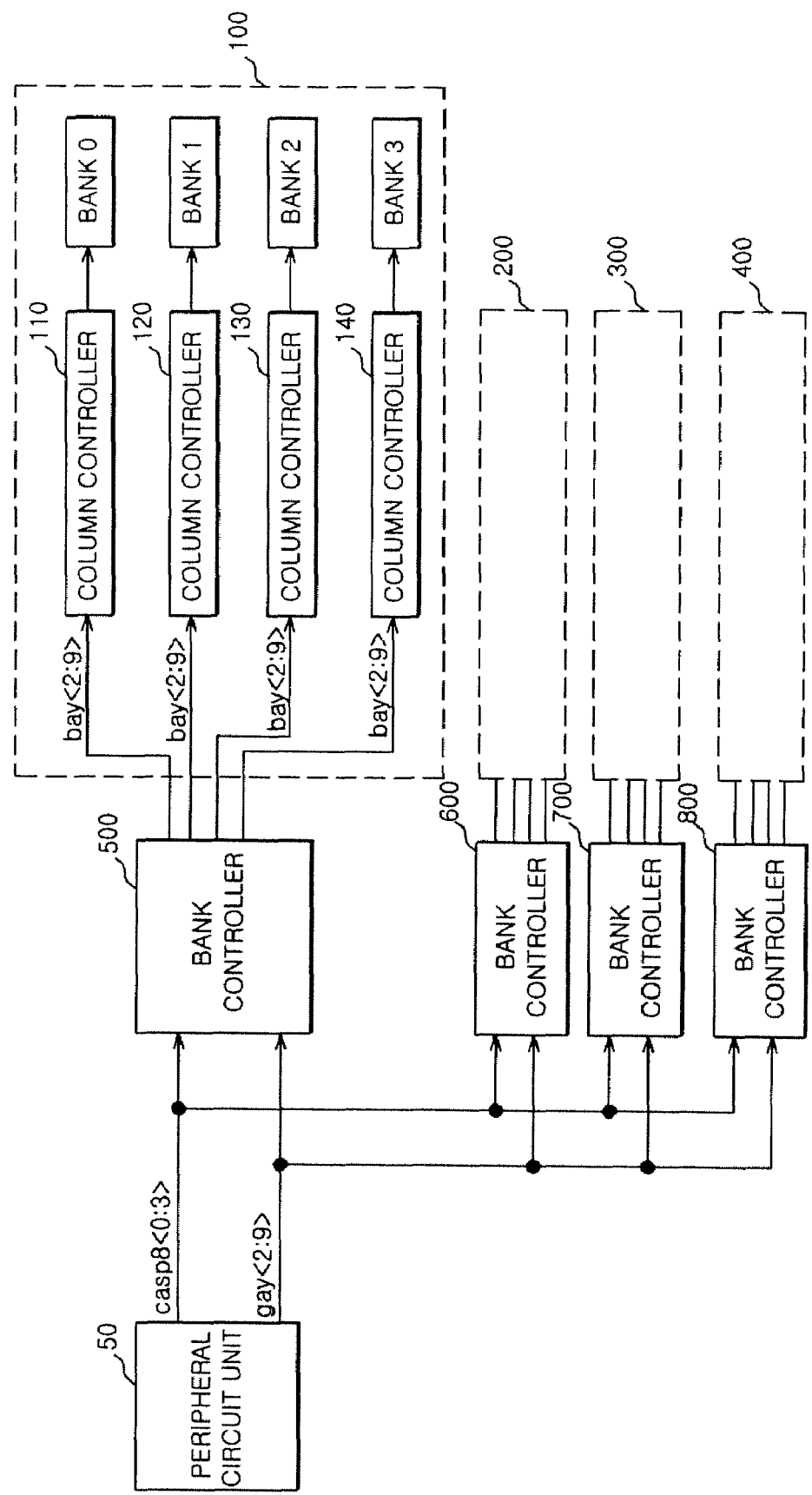
FIG. 3 is a block diagram showing the structure of an apparatus for controlling the bank of a semiconductor memory apparatus according to an embodiment of the present invention.
Figure 4:
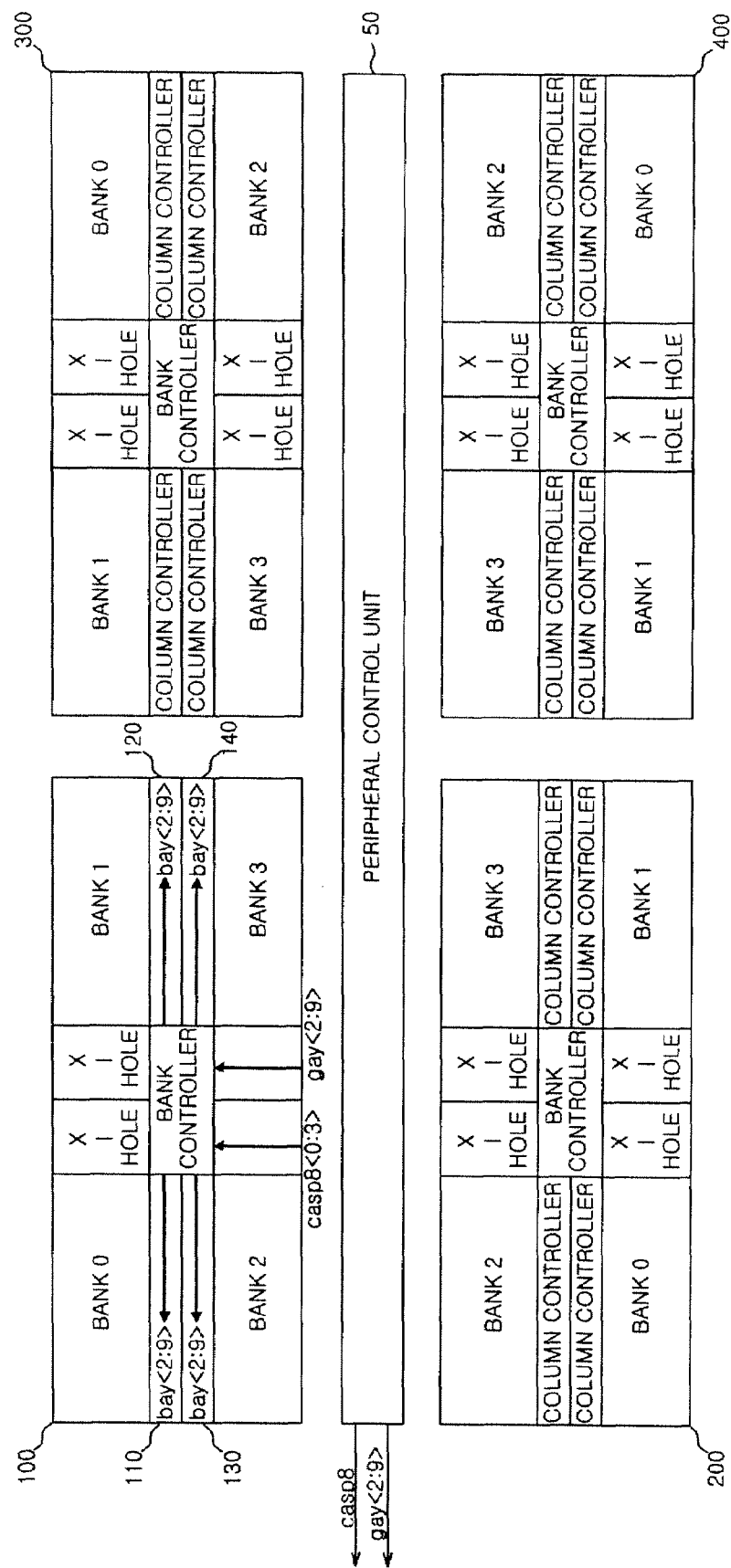
FIG. 4 is a layout diagram of an apparatus for controlling the bank of a semiconductor memory apparatus according to an embodiment of the present invention.
Figure 5:
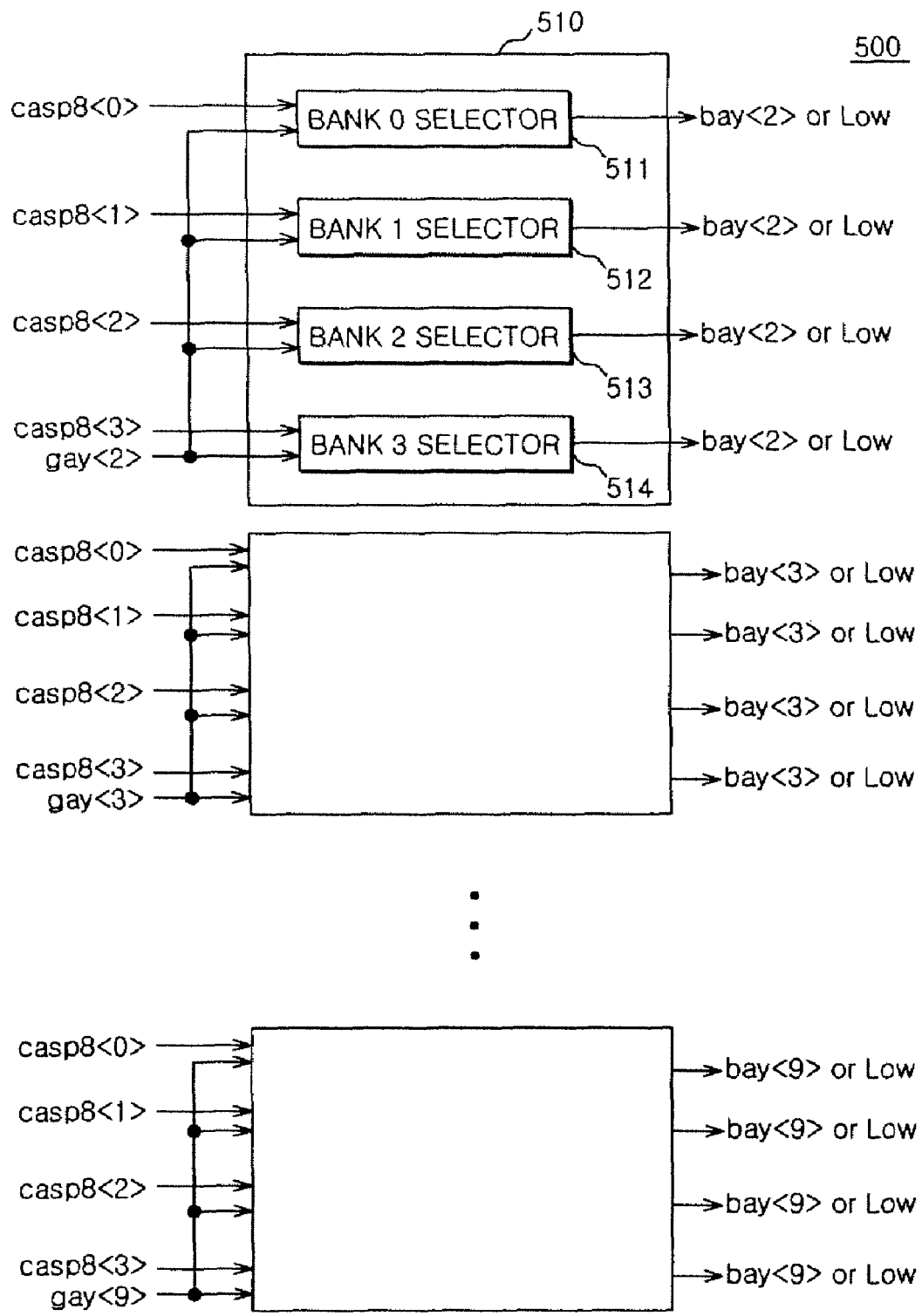
FIG. 5 is a block diagram showing the structure of a first bank controller of FIG. 3.
Figure 6:
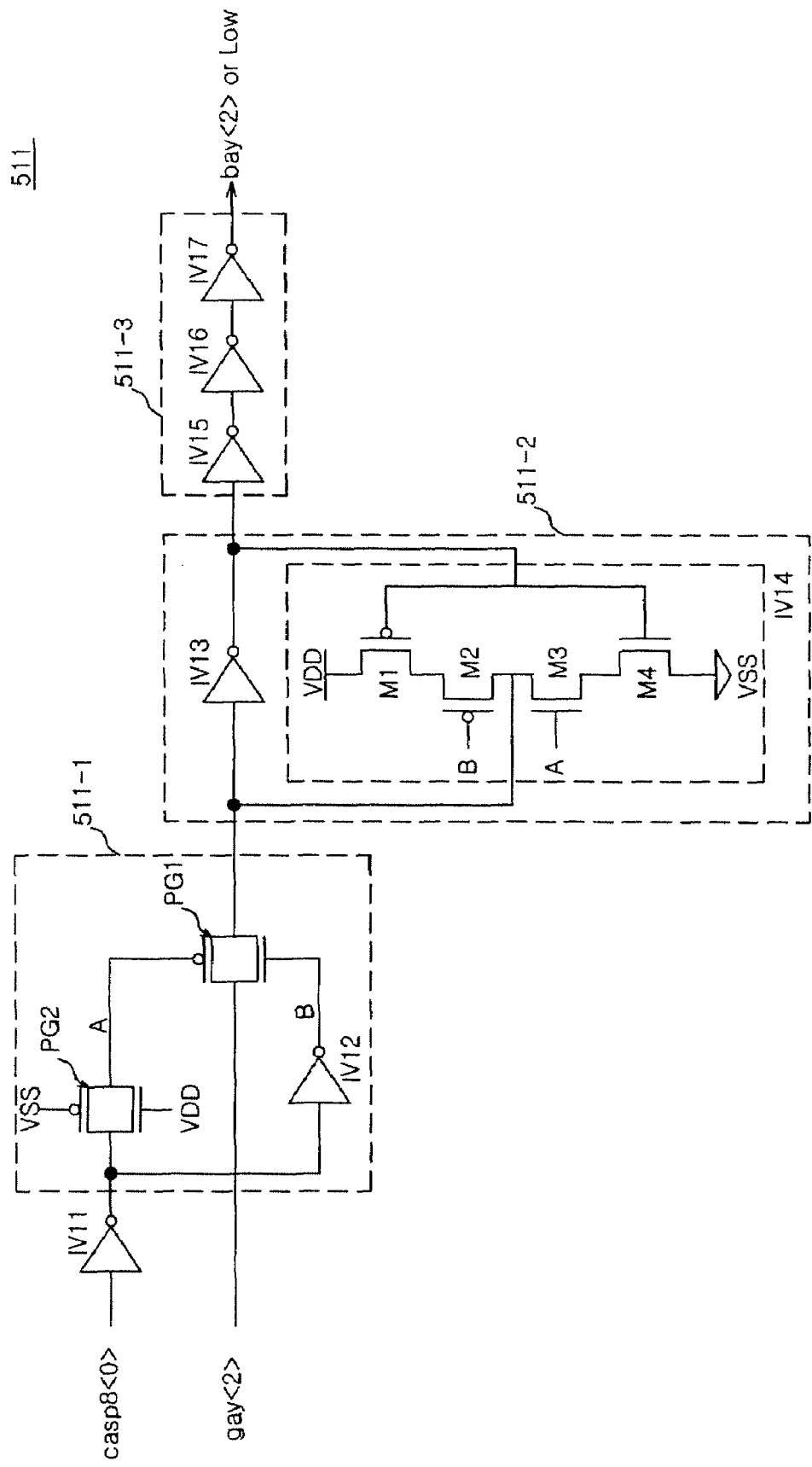
FIG. 6 is a circuit diagram showing the structure of a bank 0 selector of FIG. 5.

FIG. 3 is a block diagram showing the structure of an apparatus for controlling the bank of a semiconductor memory apparatus according to an embodiment of the present invention. FIG. 4 is a layout diagram of an apparatus for controlling the bank of a semiconductor memory according to an embodiment of the present invention. FIG. 5 is a block diagram showing the structure of a first bank controller of FIG. 3. FIG. 6 is a circuit diagram showing the structure of a bank 0 selector of FIG. 5.

As shown in FIG. 3, the apparatus for controlling the bank of a semiconductor memory apparatus according to the embodiment of the present invention includes first to fourth bank areas 100 to 400, a peripheral circuit unit 50 that generates and outputs a bank selection signal casp8<0:3> and a first address gay<2:9>, that is, a column address, and a plurality of bank controllers 500 to 800. Here, each of the plurality of bank controllers 500 to 800 generates a second address bay<2:9>, which is obtained by correcting the first address gay<2:9> to match a bank control timing with respect to each of the first to fourth bank areas 100 to 400, and outputs the second address bay<2:9> to a column controller that controls the bank corresponding to the bank selection signal casp8<0:3> from the plurality of banks (banks 0 to 3). At this time, the first address gay<2:9> and the second address bay<2:9> are column addresses for selecting a column of the bank.

As shown in FIG. 4, the first to fourth bank areas 100 to 400 have the same structure. Therefore, only the structure of the first bank area 100 is described here. The first bank area 100 includes the plurality of banks (banks 0 to 3) and column controllers 110 to 140 that control the banks (banks 0 to 3) respectively. However, since the column controllers 110 to 140 do not generate the second address bay<2:9>, corresponding NAND logics and delay configurations may be removed. Alternatively, while the known structure is used, corresponding functions may be disabled.

As shown in FIG. 4, each of the plurality of bank controllers 500 to 800 is formed at a boundary region among the plurality of banks in each of the first to fourth bank areas 100 to 400. Alternatively, the bank controllers 500 to 800 may be formed outside the first to fourth bank areas 100 to 400, respectively. However, it is preferable that each of the bank controllers 500 to 800 be formed at the boundary region among the banks in consideration of the forming of signal lines. Further, since the plurality of bank controllers 500 to 800 have the same configuration, only the configuration of the bank controller 500 is described.

As shown in FIG. 5, the bank controller 500 includes a plurality of control units, each of which receives a first address bit corresponding to each of the control units from all bits of the first address gay<2:9>, corrects the received first address bit to match a bank control timing to thereby generate a second address bit, and outputs the generated second address bit to the bank corresponding to the bank selection signal casp8<0:3> from the plurality of banks (banks 0 to 3). At this time, there are as many control units as all of the bits of the first address gay<2:9>. Even though all of the control units receive different address bits being inputted, the control units have the same configuration. The internal configuration of the control unit 510 that receives gay<2> from the all bits of the first address gay<2:9> will be described.

The control unit 510 includes a bank 0 selector 511, a bank 1 selector 512, a bank 2 selector 513, and a bank 3 selector 514, each of which corrects the timing of the first address bit gay<2> according to each bit of the bank selection signal casp8<0:3>, generates a second address bit bay<2>, and outputs the generated second address bit to each of the column controllers 110 to 140 that are connected to each of the bank selectors 511 to 514. Here, even though the bank 0 selector 511, the bank 1 selector 512, the bank 2 selector 513, and the bank 3 selector 514 receive different bits of the bank selection signal casp8<0:3>, they have the same configuration. Therefore, among them, only the internal configuration of the bank 0 selector 511 will be described.

Referring to FIG. 6, the bank 0 selector 511 includes a determination unit 511-1 that determines whether the first address bit gay<2> is inputted according to the inputted bank selection signal bit casp8<0>; a latch unit 511-2 that latches the gay<2> inputted through the determination unit 511-1 according to casp8<0> and generates the second address bit bay<2>, or fixes the output of the latch unit 511-2 at a predetermined level; and an output unit 511-3 that outputs the bay<2> generated from the latch unit 511-2.

The determination unit 511-1 includes a first inverter IV11 that receives casp8<0>, a second inverter IV12 that receives the output of the first inverter IV11, a first pass gate PG1 that has an input terminal receiving gay<2>, a first control terminal receiving the output of the first inverter IV11, and a second control terminal receiving the output of the second inverter IV12, and a second pass gate PG2 connected between an output terminal of the first inverter IV11 and the first control terminal of the first pass gate PG1.

The latch unit 511-2 includes a third inverter IV13 that inverts the output of the determination unit 511-1, and a fourth inverter IV14 that inverts the output of the third inverter IV13 according to casp8<0> and outputs the inverted output to an input terminal of the third inverter IV13. At this time, the fourth inverter IV14 includes first to fourth transistors M1 to M4 that are connected between a power terminal and a ground terminal. Here, gates of the first transistor M1 and the fourth transistor M4 are connected in common to the output unit 511-3, and a connection node between the second transistor M2 and the third transistor M3 is connected to an output terminal of the determination unit 511-1.

The output unit 511-3 includes fifth to seventh inverters IV15 to IV17 for buffering the output of the latch unit 511-2. The number of inverters may vary depending on the length of a signal line from the output unit 511-3 to the corresponding column controller.

The operation of the embodiment of the present invention having the above-described configuration is described below.

As described above, since all of the bank controllers 500 to 800, shown in FIG. 3, have the same operation, only the operation of the bank controller 500 according to the embodiment of the present invention is described.

First, the peripheral circuit unit 50 generates and outputs a bank selection signal casp8<0:3> and a first address gay<2:9>. At this time, the bank selection signal casp8<0:3> is a signal that is at a logic high level for a bit corresponding to a selected bank, and is fixed at a low level for the other bits.

Therefore, when a bit casp8<0> corresponding to the bank 0 selector 511 from bits of the bank selection signal casp8<0:3> is at a high level, the bank 0 selector 511 of the control unit 510 shown in FIG. 5 receives a bit gay<2> corresponding to the bank 0 selector 511 from bits of the first address gay<2:9>, generates a second address bit bay<2>, outputs the second address bit bay<2> to the column controller 110 of FIG. 3, and latches the second address bit bay<2>. Meanwhile, when the casp8<0> is at a low level, the bank 0 selector 511 fixes an output terminal at a predetermined level (for example, a low level) to thereby block the second address output.

That is, as shown in FIG. 6, while casp8<0> is at a high level, a low level of a node A is inputted to the first control terminal of the first pass gate PG1 through the first inverter IV11 and the second path gate PG2, and a high level of a node B is inputted to the second control terminal of the first pass gate PG1 through the second inverter IV12. Therefore, the first pass gate PG1 is turned on and gay<2> is inputted. At this time, since the node A is at the low level and the node B is at the high level, the fourth inverter IV14 of the latch unit 511-2 does not operate. The second address bit Bay<2> is outputted through the fifth to seventh inverters IV15 to IV17 of the output unit 511-3.

While casp8<0> is at a low level, the first pass gate PG1 is turned off, the node A becomes the high level, and the node B becomes the low level, such that the fourth inverter IV14 operates. Therefore, while the casp8<0> is at the low level, the address inputted through the first pass gate PG1 is latched.

At this time, according to the related art, a timing margin is ensured by delaying the address. However, in the embodiment of the present invention, the timing margin is ensured according to a method that latches the current address until a new address is inputted.

As described, when casp8<0> is not a selected bit, casp8<0> is maintained at the low level from the start of the operation. At this time, the node A becomes the high level, and the node B becomes the low level. Therefore, the first pass gate PG1 remains turned off, and the latch unit 511-2 and the determination unit 511-1 are in a floating state. As a result, an input level of the fourth inverter IV14 is not determined, and thus an output level thereof becomes unstable. When the node A becomes a high level, the third transistor M3 is turned on, and thus the fourth inverter IV14 outputs a ground level to the input terminal of the third inverter IV13. Therefore, an output level of the output unit 511-3 is fixed at the low level. That is, when casp8<0> is a selected bit, the fourth inverter IV14 serves as a latch, and when casp8<0> is not a selected bit, the fourth inverter IV14 stablizes the output level by fixing the output level at a predetermined level.

At the same time, each of the bank 1 selector 512, the bank 2 selector 513, and the bank 3 selector 514 also perform the same operation as the bank 0 selector 511 according to casp8<1:3>. The control units according to the respective bits of the first address gay<3:9> also perform the same operations as the control unit 510.

Then, among the column controllers 110 to 140, the column controller to which the second address bay<2:9> is inputted, controls input and output of data of the corresponding bank by using the second address bay<2:9>.

It will be apparent to those skilled in the art that various modifications and changes may be made without departing from the scope and spirit of the invention. Therefore, it should be understood that the above embodiments are not limiting, but illustrative in all aspects. The scope of the invention is defined by the appended claims rather than by the description preceding them, and therefore all changes and modifications that fall within the metes and bounds of the claims, or equivalents of such metes and bounds are therefore intended to be embraced by the claims.

The apparatus for controlling bank of a semiconductor memory apparatus and the method of controlling the same according to the disclosed embodiment of the present invention have the following effects.

First, since it is easy to ensure a timing margin according to a method that latches an address, it is possible to completely prevent an address generation error, and it can be applied to a high-frequency system because it is easy to ensure the timing margin.

Second, as shown in FIG. 4, it is possible to minimize a layout area because the delay logics and the associated logics of the column controllers, and the signal lines for supplying the bank selection signal to the column controllers are removed.

Third, since the operation of the logic circuit for ensuring a timing margin is unnecessary inside the column controllers, it is possible to reduce current consumption.

What is claimed is:

1. An semiconductor memory apparatus, comprising:
a bank controller including a latch unit configured to latch a present address until a new address is inputted thereby generating a latched address, and to provide the latched address to a column controller of a bank corresponding to a bank selection signal.

2. The apparatus of claim 1, further comprising:
a peripheral circuit unit configured to generate the bank selection signal and the address.

3. The apparatus of claim 1,
wherein the column controller is configured to control the input and output of data of the bank according to the latched address.

4. The apparatus of claim 1,
wherein the bank controller includes a plurality of control units, each of which is configured to latch the present address so as to match a bank control timing.

5. The apparatus of claim 4,
wherein the control unit includes a bank selector,
the bank selector includes:
a determination unit configured to receive the bank selection signal and to determine input of the present address; and
the latch unit configured to receive the present address and to latch the present address or to fix an output signal level at a predetermined level.

6. The apparatus of claim 5,
wherein the determination unit includes:
a first inverter configured to receive the bank selection signal;
a second inverter configured to receive the output of the first inverter; and
a first transmitting part having an input terminal receiving the first address, a first control terminal having an input to receive the output of the first inverter, and a second control terminal having an input to receive the output of the second inverter.

7. The apparatus of claim 5, further comprising:
an output unit configured to buffer the output signal of the latch unit.

8. The apparatus of claim 5,
wherein the bank controller is arranged in a memory area.

9. An apparatus for controlling a bank of a semiconductor memory apparatus, comprising:
a plurality of bank controllers, each of which is configured to generate a second address by correcting a first address to match a bank control timing.

10. The apparatus of claim 9,
wherein each of the bank controllers includes a plurality of control units,
each of which includes a plurality of bank selectors connected to one of a plurality of banks respectively,
each bank selector is configured to latch a timing of the first address, thereby generating the second address, and to provide the second address to the corresponding bank.

11. The apparatus of claim 10,
wherein the bank selector includes:
a determination unit configured to receive a bank selection signal and determine whether the first address is inputted;
a latch unit configured to receive an output signal of the determination unit according to the bank selection signal, and to generate the second address or to fix the second address at a predetermined level; and
an output unit configured to buffer an output signal of the latch unit.

* * * * *